United States Patent
Kuo

(10) Patent No.: US 12,274,175 B2
(45) Date of Patent: Apr. 8, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventor: Chih-Wei Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 299 days.

(21) Appl. No.: 17/565,496

(22) Filed: Dec. 30, 2021

(65) Prior Publication Data

US 2023/0180619 A1 Jun. 8, 2023

(30) Foreign Application Priority Data

Dec. 3, 2021 (CN) .......................... 202111474803.7

(51) Int. Cl.
*G11C 11/00* (2006.01)
*G11C 11/16* (2006.01)
*H10B 61/00* (2023.01)
*H10N 50/01* (2023.01)
*H10N 50/10* (2023.01)
*H10N 50/80* (2023.01)
*H10N 50/85* (2023.01)

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ......... G11C 11/16; G11C 13/00; H10B 61/00; H10N 50/10
See application file for complete search history.

(56) References Cited

U.S. PATENT DOCUMENTS

| | | | |
|---|---|---|---|
| 7,531,367 B2 | 5/2009 | Assefa et al. | |
| 9,590,173 B2 | 3/2017 | Iwayama | |
| 2009/0261433 A1* | 10/2009 | Kang ...................... | H10N 50/01 257/E29.323 |
| 2014/0042567 A1* | 2/2014 | Jung ...................... | H10N 50/10 257/E43.001 |
| 2014/0264679 A1* | 9/2014 | Lee ......................... | H10N 50/10 257/427 |
| 2016/0260892 A1* | 9/2016 | Tahmasebi ............. | H10B 61/22 |
| 2018/0123027 A1* | 5/2018 | Yamane ................. | H10N 50/80 |
| 2020/0035907 A1* | 1/2020 | Peng ..................... | H10N 50/10 |
| 2020/0350491 A1* | 11/2020 | Chuang ................. | H10N 50/10 |

* cited by examiner

*Primary Examiner* — Hien N Nguyen
(74) *Attorney, Agent, or Firm* — Winston Hsu

(57) ABSTRACT

A semiconductor device includes a first inter-metal dielectric (IMD) layer on a substrate, a first metal interconnection in the first IMD layer, a second IMD layer on the first IMD layer, a second metal interconnection in the second IMD layer, a bottom electrode on the second metal interconnection, a magnetic tunneling junction (MTJ) on the bottom electrode, a top electrode on the MTJ, a cap layer adjacent to the MTJ, a third IMD layer on the MTJ, and a third metal interconnection in the third IMD layer for connecting the top electrode and the first metal interconnection. Preferably, a width of a bottom surface of the MTJ is less than a width of a top surface of the MTJ.

11 Claims, 5 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes forming a magnetic tunneling junction (MTJ) on a substrate, in which a width of a bottom surface of the MTJ is less than a width of a top surface of the MTJ.

According to another aspect of the present invention, a semiconductor device includes a first inter-metal dielectric (IMD) layer on a substrate, a first metal interconnection in the first IMD layer, a second IMD layer on the first IMD layer, a second metal interconnection in the second IMD layer, a bottom electrode on the second metal interconnection, a magnetic tunneling junction (MTJ) on the bottom electrode, a top electrode on the MTJ, a cap layer adjacent to the MTJ, a third IMD layer on the MTJ, and a third metal interconnection in the third IMD layer for connecting the top electrode and the first metal interconnection. Preferably, a width of a bottom surface of the MTJ is less than a width of a top surface of the MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
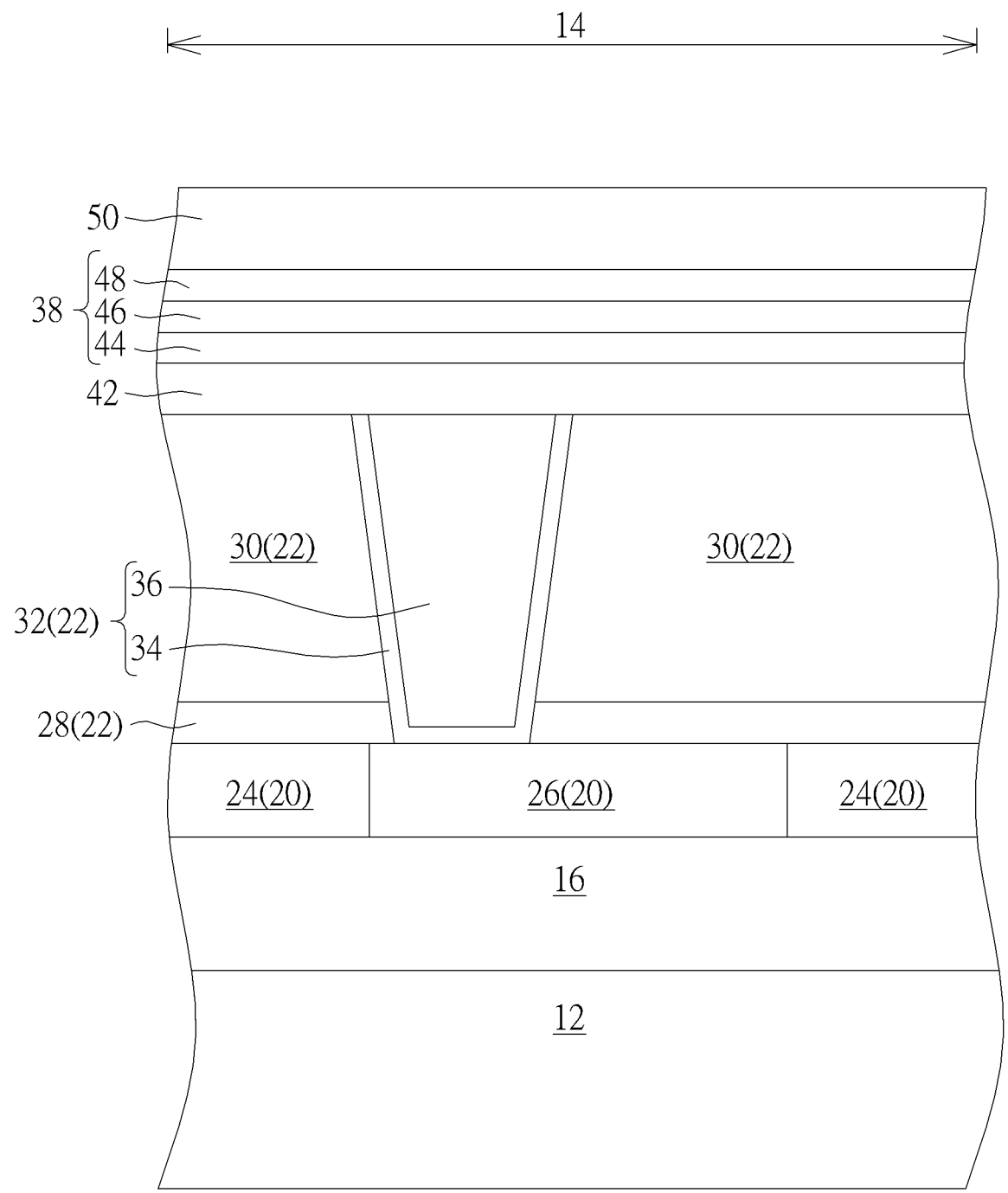
FIGS. 1-4 illustrate a method for fabricating a MRAM device according to an embodiment of the present invention.

Referring to FIGS. 1-4, FIGS. 1-4 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal interconnections 26 are preferably made of copper, the metal layer 36 in the metal interconnection 32 is preferably made of tungsten, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode 42 and the top electrode 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide (AlOx) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
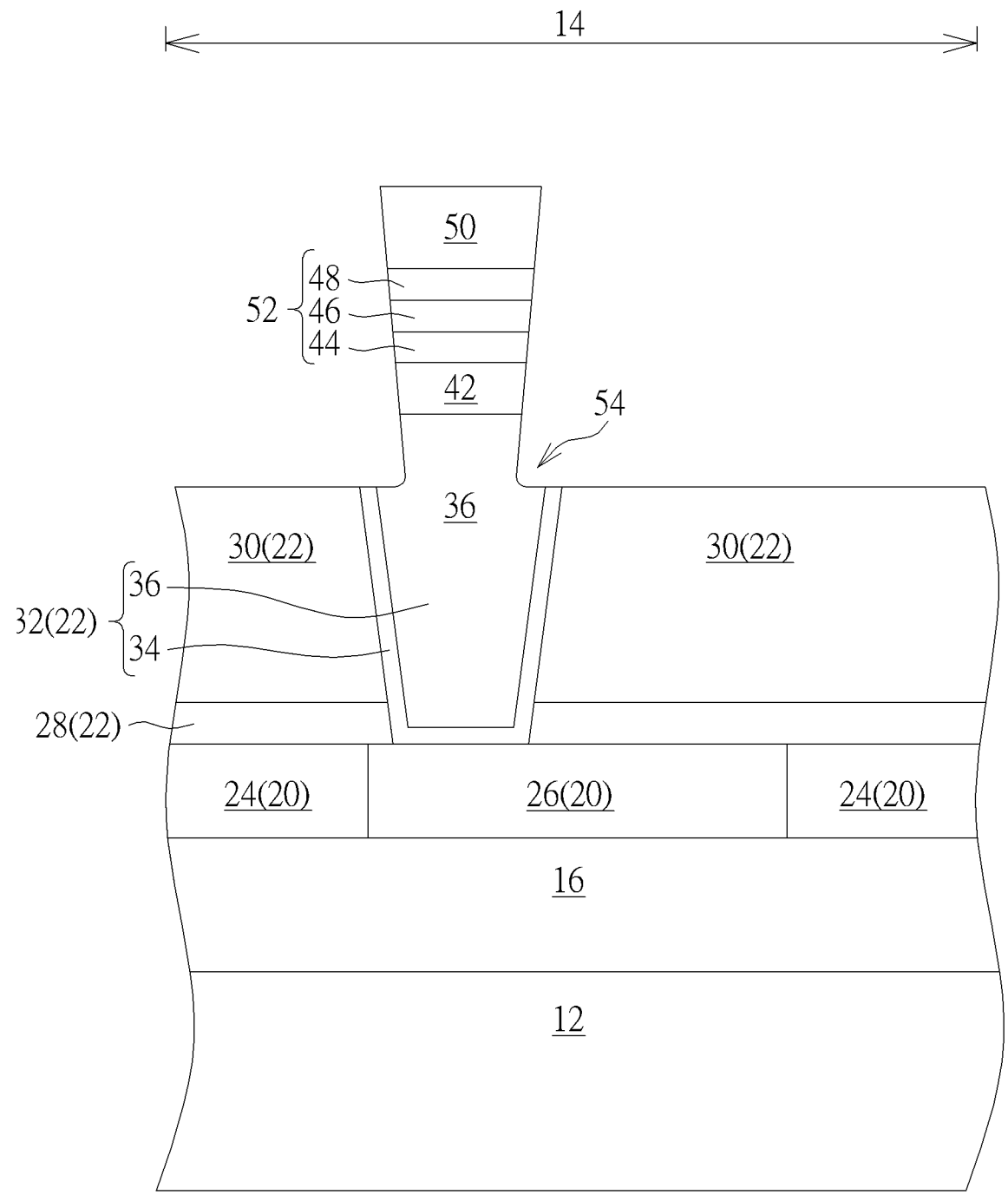

Next, as shown in FIG. 2, one or more etching process is conducted by using the patterned mask as mask to remove part of the top electrode 50, part of the MTJ stack 38, part of the bottom electrode 42, and part of the IMD layer 30 to form at least a MTJ 52 on the MRAM region 14. It should be noted that a reactive ion etching (RIE) and/or an ion beam etching (IBE) process is conducted to remove the top electrode 50, the MTJ stack 38, the bottom electrode 42, and the IMD layer 38 in this embodiment for forming the MTJ 52. Preferably, when the IBE process is conducted to pattern the top electrode 50, the MTJ stack 38, and the bottom electrode 42, it would be desirable to adjust the angle of bombardment of the etching gas so that the etching process is not only conducted vertically but also at a slanted angle to trim the aforementioned stack structure. This creates a shadowing effect and forms a structure having the top electrode 50, the MTJ 52, and bottom electrode 42 with wide top and narrow bottom.

In this embodiment, since each of the top electrode 50, the MTJ 52, and the bottom electrode 42 all having wide top and narrow bottom profile with inclined sidewalls, the width of bottom surface of each of the material layers would be slightly less than the width of the top surface of the same material layer. For instance, the width of the bottom surface of the bottom electrode 42 is less than the width of the top surface of the bottom electrode 42, the width of the bottom surface of the MTJ 52 is less than the width of the top surface of the MTJ 52, and the width of the bottom surface of the top electrode 52 is less than the width of the top surface of the top electrode 52. Moreover, the angle included by the inclined sidewalls of the top electrode 50, MTJ 52, and bottom electrode 42 and the top surface of the IMD layer 30 adjacent to two sides of the metal interconnection 32 is preferably less than 90 degrees or more preferably between 80-85 degrees. It should also be noted that when the IBE process is conducted to remove part of the IMD layer 30, part of the metal interconnection 32 could also be removed to form a step portion 54 on sidewall of the metal interconnection 32 adjacent to the bottom electrode 42.

Figure 3:
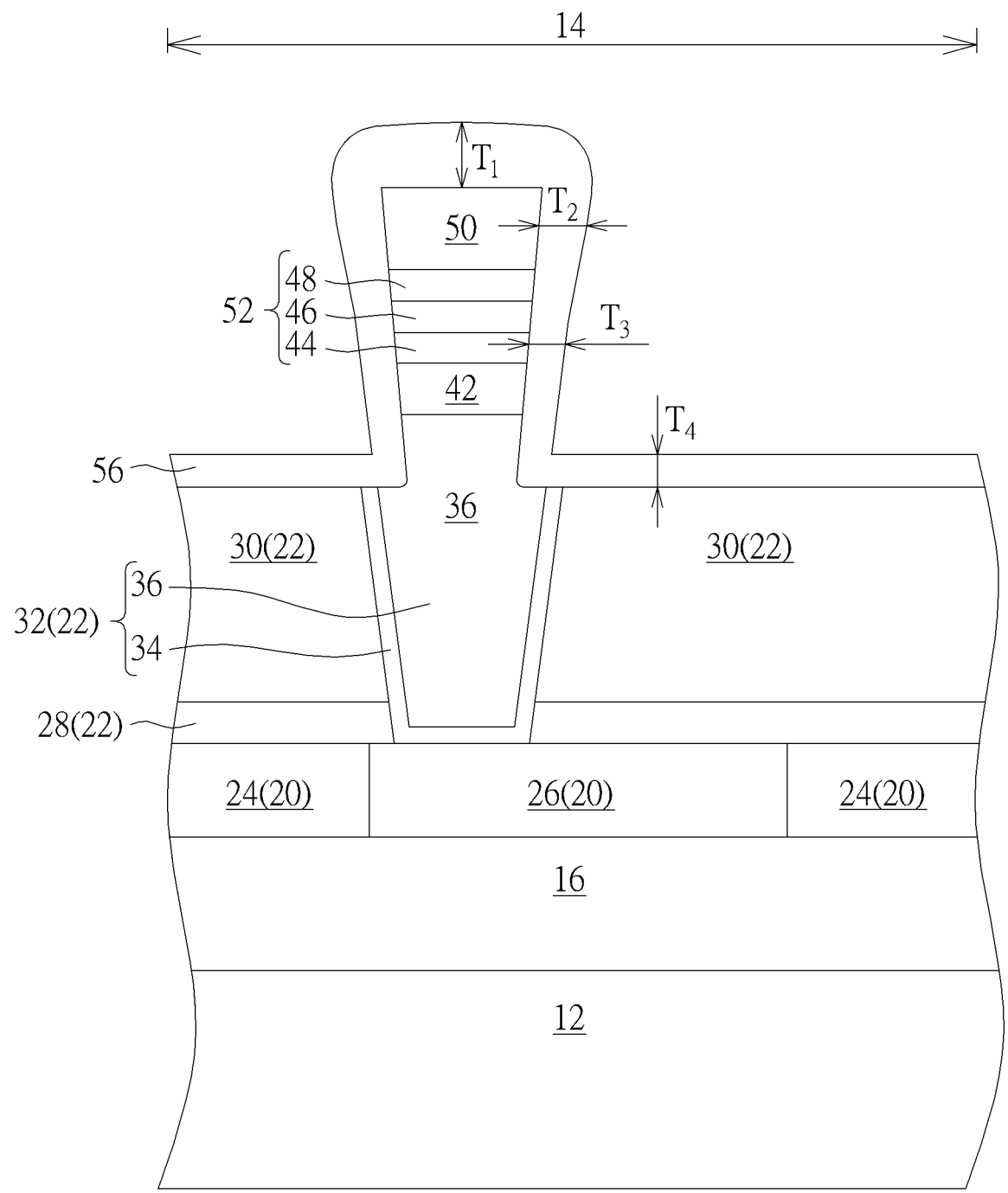

Next, as shown in FIG. 3, a cap layer 56 is formed on the MTJ 52 and covering the surface of the IMD layer 30. It should be noted that a plasma enhanced chemical vapor deposition (PECVD) process is preferably conducted to inject reacting gas such as ammonia and/or silane ($SiH_4$) to form the cap layer 5, in which the proportion of the ammonia gas and silane and power of the etching equipment are adjusted to form an overhang at the cap layer 56 adjacent to top portion and two sides of the top electrode 50. Specifically, the cap layer 56 formed on the MTJ 52 or more specifically top surface of the top electrode 50, sidewalls of the top electrode 50, sidewalls of the MTJ 52, and sidewalls of the bottom electrode 42 preferably includes different or uneven thicknesses. For instance, the thickness $T_1$ of the cap layer 56 directly contacting the top surface of the top electrode 50 is slightly greater than or equal to the thickness $T_2$ of the cap layer 56 directly contacting a sidewall of the top electrode 50, the thickness $T_2$ of the cap layer 56 directly contacting a sidewall of the top electrode 50 is greater than the thickness $T_3$ of the cap layer 56 directly contacting the MTJ 52, and the thickness $T_3$ of the cap layer 56 directly contacting the MTJ 52 is greater than or equal to the thickness $T_4$ of the cap layer 56 directly contacting the top surface of the IMD layer 30.

Specifically, the thickness $T_1$ of the cap layer 56 directly contacting the top surface of the top electrode 50 is between 240-270 Angstroms or more preferably at 260 Angstroms, the thickness $T_2$ of the cap layer 56 directly contacting sidewall of the top electrode 50 is between 240-260 Angstroms or more preferably at 250 Angstroms, the thickness $T_3$ of the cap layer 56 directly contacting the MTJ 52 is between 190-210 Angstroms or more preferably at 200 Angstroms, and the thickness $T_4$ of the cap layer 56 directly contacting the top surface of the IMD layer 30 is between 190-210 Angstroms or more preferably at 200 Angstroms. In this embodiment, the cap layer 56 preferably includes silicon nitride, but could also include other dielectric material including but not limited to for example silicon oxide, silicon oxynitride (SiON), or silicon carbon nitride (SiCN).

Figure 4:
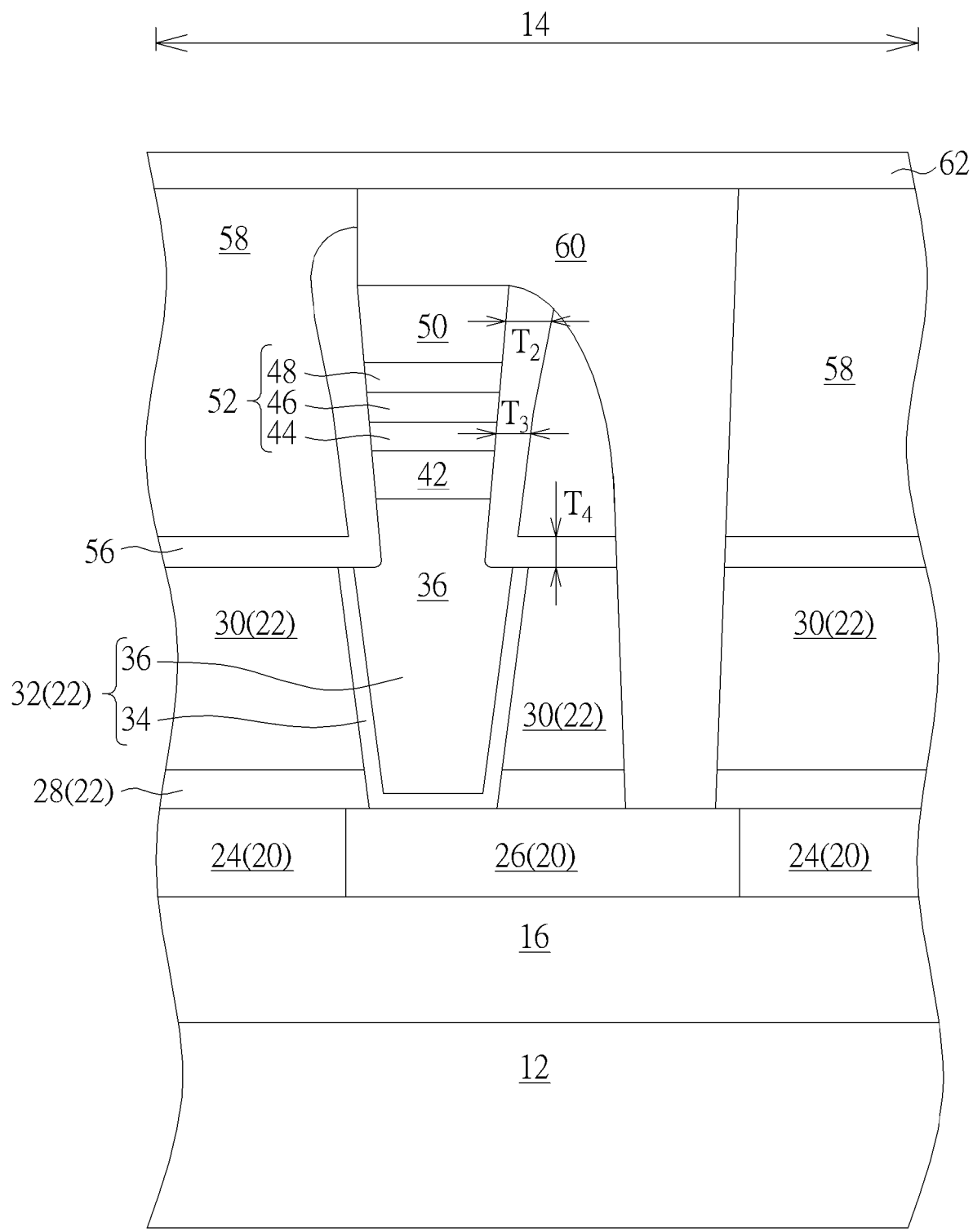

Next, as shown in FIG. 4, an IMD layer 58 is formed on the cap layer 56, a selective planarizing process such as chemical mechanical polishing (CMP) process is conducted to remove part of the IMD layer 58, and one or more photo-etching process is conducted to remove part of the IMD layer 58, part of the cap layer 56, part of the IMD layer 30, and part of the stop layer 28 to form a contact hole (not shown) exposing the surface of the metal interconnection 26. Next, conductive materials are deposited into the contact hole and a planarizing process such as CMP is conducted to form a metal interconnections 60 connecting the MTJ 52 and the metal interconnection 26 underneath. Next, another stop layer 62 is formed on the IMD layer 58 to cover the metal interconnection 60.

In this embodiment, the stop layers 62 and 28 could be made of same or different materials, in which the two layers 62, 28 could all include nitrogen doped carbide (NDC), silicon nitride, silicon carbon nitride (SiCN), or combination thereof. Similar to the metal interconnections formed previously, the metal interconnection 60 could be formed in the IMD layer 58 through a single damascene or dual damascene process. For instance, metal interconnection 60 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 4, FIG. 4 further illustrates a structural view of a MRAM device according to an embodiment of the present invention. As shown in FIG. 4, the MRAM device includes an IMD layer 24 disposed on the substrate 12, a metal interconnection 26 disposed in the IMD layer 24, an IMD layer 30 disposed on the metal interconnection 24, a metal interconnection 32 disposed in the IMD layer 30, a bottom electrode 42 disposed on the metal interconnection 32, a MTJ 52 disposed on the bottom electrode 42, a top electrode 50 disposed on the MTJ 52, a cap layer 56 disposed adjacent to the MTJ 52, an IMD layer 58 disposed on the cap layer 56, and a metal interconnection 60 disposed in the IMD layer 58 and directly contacting the top electrode 50 and the metal interconnection 26 at the same time. Preferably, the sidewall of the metal interconnection 60 is aligned with the sidewall of the top electrode 50 and a cross-section view of the metal interconnection 60 includes a L-shape.

In this embodiment, since each of the top electrode 50, the MTJ 52, and the bottom electrode 42 all having wide top and narrow bottom profile with inclined sidewalls, the width of bottom surface of each of the material layers is slightly less than the width of the top surface of the same material layer. For instance, the width of the bottom surface of the bottom electrode 42 is less than the width of the top surface of the bottom electrode 42, the width of the bottom surface of the MTJ 52 is less than the width of the top surface of the MTJ 52, and the width of the bottom surface of the top electrode 52 is less than the width of the top surface of the top electrode 52. Moreover, the angle included by the inclined sidewalls of the top electrode 50, MTJ 52, and bottom electrode 42 and the top surface of the IMD layer 30 adjacent to two sides of the metal interconnection 32 is preferably less than 90 degrees or more preferably between 80-85 degrees.

Moreover, the cap layer 56 formed on the top surface of the top electrode 50, sidewalls of the top electrode 50, sidewalls of the MTJ 52, and sidewalls of the bottom electrode 42 preferably includes different or uneven thicknesses. For instance, the thickness $T_2$ of the cap layer 56 directly contacting a sidewall of the top electrode 50 is greater than the thickness $T_3$ of the cap layer 56 directly contacting the MTJ 52, and the thickness $T_3$ of the cap layer 56 directly contacting the MTJ 52 is greater than or equal to the thickness Ta of the cap layer 56 directly contacting the top surface of the IMD layer 30.

Specifically, the thickness $T_2$ of the cap layer 56 directly contacting sidewall of the top electrode 50 is between 240-260 Angstroms or more preferably at 250 Angstroms, the thickness $T_3$ of the cap layer 56 directly contacting the MTJ 52 is between 190-210 Angstroms or more preferably at 200 Angstroms, and the thickness $T_4$ of the cap layer 56 directly contacting the top surface of the IMD layer 30 is between 190-210 Angstroms or more preferably at 200 Angstroms. In this embodiment, the cap layer 56 preferably includes silicon nitride, but could also include other dielectric material including but not limited to for example silicon oxide, silicon oxynitride (SiON), or silicon carbon nitride (SiCN).

Figure 5:
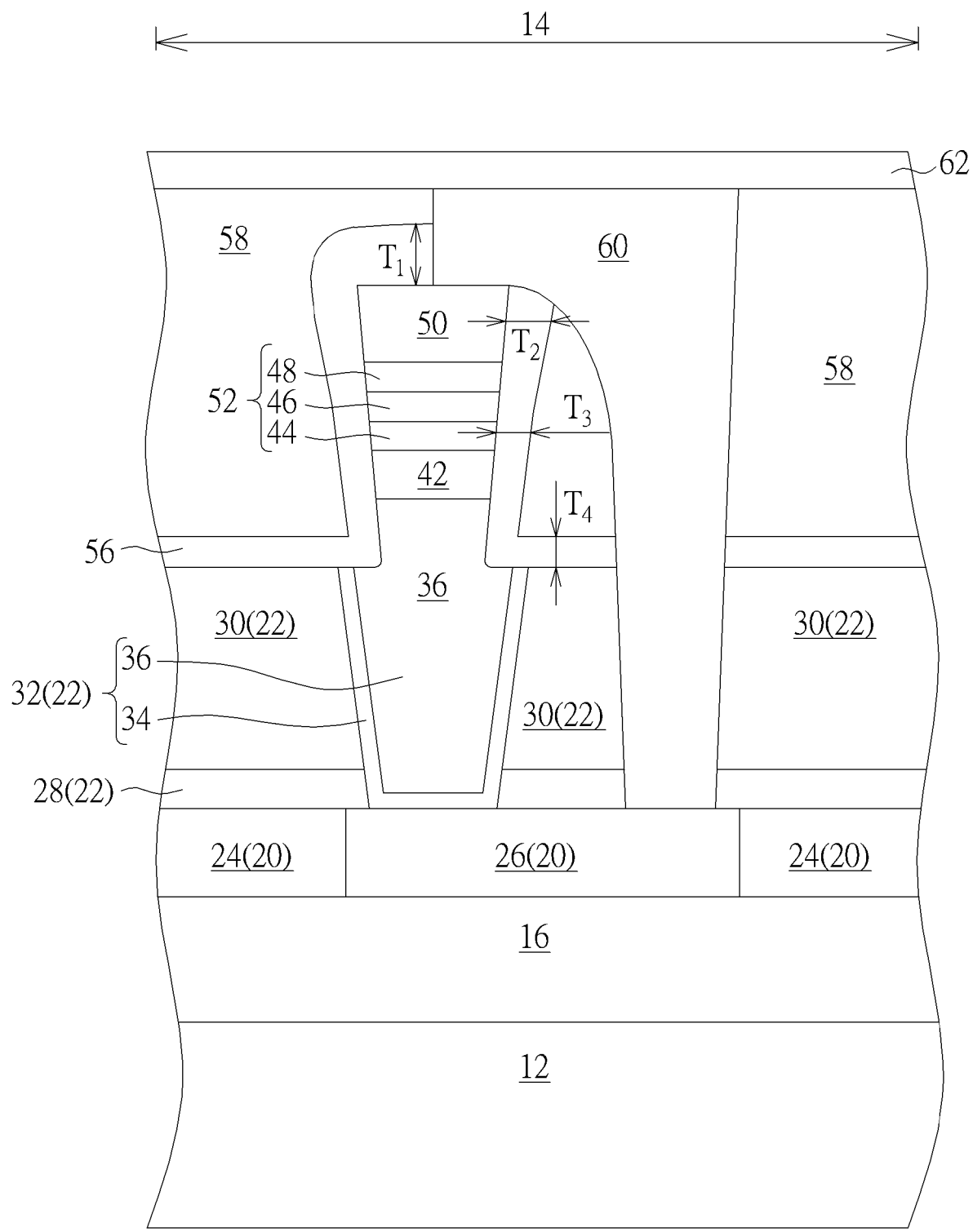
FIG. 5 further illustrates a structural view of a MRAM device according to an embodiment of the present invention.

Referring again to FIG. 5, FIG. 5 further illustrates a structural view of a MRAM device according to an embodiment of the present invention. As shown in FIG. 5, in contrast to the cap layer 56 in FIG. 4 is only disposed on sidewalls of the top electrode 50 and the MTJ 52 but not directly on top surface of the top electrode 50, it would also be desirable to slightly adjust the position of the exposure during the formation of the metal interconnection 60 to only remove part of the cap layer 56 directly on the top surface of the top electrode 50. By doing so, the metal interconnection 60 directly contacting the top surface of the top electrode 50 is moved slightly to the right without covering the entire top surface of the top electrode 50 and part of the cap layer 56 and part of the metal interconnection 60 would contact the top surface of the top electrode 50 at the same time.

In this embodiment, the cap layer 56 formed on the top surface of the top electrode 50, sidewalls of the top electrode 50, sidewalls of the MTJ 52, and sidewalls of the bottom electrode 42 preferably includes different or uneven thicknesses. For instance, the thickness $T_1$ of the cap layer 56 directly contacting the top surface of the top electrode 50 is slightly greater than or equal to the thickness $T_2$ of the cap layer 56 directly contacting a sidewall of the top electrode 50, the thickness $T_2$ of the cap layer 56 directly contacting a sidewall of the top electrode 50 is greater than the thickness $T_3$ of the cap layer 56 directly contacting the MTJ 52, and the thickness $T_3$ of the cap layer 56 directly contacting the MTJ 52 is greater than or equal to the thickness $T_4$ of the cap layer 56 directly contacting the top surface of the IMD layer 30.

Similar to the aforementioned embodiment, the thickness $T_1$ of the cap layer 56 directly contacting the top surface of the top electrode 50 is between 240-270 Angstroms or more preferably at 260 Angstroms, the thickness $T_2$ of the cap layer 56 directly contacting sidewall of the top electrode 50 is between 240-260 Angstroms or more preferably at 250 Angstroms, the thickness $T_3$ of the cap layer 56 directly contacting the MTJ 52 is between 190-210 Angstroms or more preferably at 200 Angstroms, and the thickness $T_4$ of the cap layer 56 directly contacting the top surface of the IMD layer 30 is between 190-210 Angstroms or more preferably at 200 Angstroms. The cap layer 56 preferably includes silicon nitride, but could also include other dielectric material including but not limited to for example silicon oxide, silicon oxynitride (SiON), or silicon carbon nitride (SiCN).

Overall, the present invention preferably adjusts the bombardment angle of the etching gas during formation of the MTJ by patterning the top electrode, MTJ stack, and bottom electrode to form top electrode, MTJ, and bottom electrode with wide top and narrow bottom profile. Next, a cap layer 56 is formed on the top electrode and in this manner the cap layer adjacent to two sides of the top electrode would form overhang portions to protect sidewalls of the MTJ and the top electrode. By using this approach of forming overhang adjacent to the top electrode, metal interconnection formed thereafter to connect the top electrode and the lower level metal interconnection through metal interconnect process would not be too close to the top electrode and contamination of the MTJ could be prevented.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for fabricating a semiconductor device, comprising:
   forming a magnetic tunneling junction (MTJ) stack and a top electrode on a substrate; and
   trimming the top electrode and the MTJ stack vertically and at a slanted angle to form a MTJ having a wide top and a narrow bottom, wherein a width of a bottom surface of the MTJ is less than a width of a top surface of the MTJ.

2. The method of claim 1, further comprising:
   forming a first inter-metal dielectric (IMD) layer on a substrate;
   forming a first metal interconnection in the first IMD layer;
   forming a second IMD layer on the first IMD layer;
   forming a second metal interconnection in the second IMD layer;
   forming a bottom electrode on the second metal interconnection;
   forming a MTJ stack on the bottom electrode;
   forming the top electrode on the MTJ stack;
   patterning the top electrode, the MTJ stack, and the bottom electrode to form the MTJ;
   forming a cap layer on the top electrode;
   forming a third IMD layer on the cap layer; and
   forming a third metal interconnection in the third IMD layer for connecting the top electrode and the first metal interconnection.

3. The method of claim 2, wherein the third metal interconnection comprises a L-shape.

4. The method of claim 2, wherein a width of a bottom surface of the bottom electrode is less than a width of a top surface of the bottom electrode.

5. The method of claim 2, wherein a thickness of the cap layer adjacent to the MTJ is less than a thickness of the cap layer adjacent to the top electrode.

6. A semiconductor device, comprising:
   a first inter-metal dielectric (IMD) layer on a substrate;
   a first metal interconnection in the first IMD layer;
   a second metal interconnection on the first metal interconnection;
   a magnetic tunneling junction (MTJ) on the second metal interconnection, wherein a width of a bottom surface of the MTJ is less than a width of a top surface of the MTJ and the MTJ comprises:
      a pinned layer on the substrate;
      a barrier layer on the pinned layer; and
      a free layer on the barrier layer, wherein a width of a top surface of the free layer is greater than a width of a top surface of the barrier layer;
   a top electrode on the MTJ; and
   a third metal interconnection on the top electrode and connecting the top electrode and the first metal interconnection.

7. The semiconductor device of claim 6, further comprising:
   a second IMD layer on the first IMD layer;
   the second metal interconnection in the second IMD layer;
   a bottom electrode on the second metal interconnection;
   the MTJ on the bottom electrode;
   a cap layer adjacent to the MTJ;
   a third IMD layer on the cap layer; and
   the third metal interconnection in the third IMD layer for connecting the top electrode and the first metal interconnection.

8. The semiconductor device of claim 7, wherein the third metal interconnection comprises a L-shape.

9. The semiconductor device of claim 7, wherein a width of a bottom surface of the bottom electrode is less than a width of a top surface of the bottom electrode.

10. The semiconductor device of claim 7, wherein a width of a bottom surface of the top electrode is less than a width of a top surface of the top electrode.

11. The semiconductor device of claim 7, wherein a thickness of the cap layer adjacent to the MTJ is less than a thickness of the cap layer adjacent to the top electrode.

* * * * *